(12) United States Patent
Shao et al.

(10) Patent No.: US 11,383,973 B2
(45) Date of Patent: Jul. 12, 2022

(54) SENSOR DEVICE AND METHOD OF FABRICATION

(71) Applicant: NXP USA, Inc., Austin, TX (US)

(72) Inventors: Peng Shao, Chandler, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 220 days.

(21) Appl. No.: 16/749,510

(22) Filed: Jan. 22, 2020

(65) Prior Publication Data
US 2021/0221677 A1    Jul. 22, 2021

(51) Int. Cl.
*B81B 3/00* (2006.01)
*B81C 1/00* (2006.01)

(52) U.S. Cl.
CPC ........ *B81C 1/00166* (2013.01); *B81B 3/0021* (2013.01); *B81B 2201/0235* (2013.01); *B81B 2201/0242* (2013.01); *B81B 2203/0307* (2013.01); *B81B 2203/04* (2013.01); *B81B 2203/051* (2013.01); *B81B 2203/053* (2013.01); *B81C 2201/0132* (2013.01)

(58) Field of Classification Search
CPC .................................................. B81B 3/0021
See application file for complete search history.

(56) References Cited

U.S. PATENT DOCUMENTS

| | | | |
|---|---|---|---|
| 5,331,852 A | 7/1994 | Greiff et al. | |
| 7,971,483 B2 | 7/2011 | Supino et al. | |
| 8,508,003 B2 | 8/2013 | Yoshida | |
| 2005/0172714 A1* | 8/2005 | Challoner | G01C 19/5684 73/504.12 |
| 2007/0240509 A1 | 10/2007 | Uchiyama et al. | |
| 2010/0005884 A1 | 1/2010 | Weinberg et al. | |
| 2012/0276674 A1 | 11/2012 | Mehregany | |
| 2014/0197713 A1 | 7/2014 | Graham et al. | |
| 2015/0360937 A1* | 12/2015 | Reinmuth | B81B 7/0038 257/417 |
| 2016/0137485 A1 | 5/2016 | Graham et al. | |
| 2016/0187370 A1* | 6/2016 | Ikehashi | G01L 19/0618 73/514.32 |
| 2016/0370182 A1* | 12/2016 | Shao | G01C 19/5769 |

* cited by examiner

*Primary Examiner* — Moazzam Hossain

(57) ABSTRACT

A device includes a substrate, a first electrode formed on the substrate and a structural layer formed on the substrate. The structural layer includes a movable mass and a fixed portion, the movable mass being suspended above the substrate and the first electrode being interposed between the substrate and the movable mass. A second electrode is spaced apart from an upper surface of the movable mass by a gap and an anchor couples the second electrode to the fixed portion of the structural layer. A method entails integrating formation of the second electrode into a wafer process flow in which the first electrode and the structural layer are formed.

19 Claims, 6 Drawing Sheets

SENSOR DEVICE AND METHOD OF FABRICATION

TECHNICAL FIELD OF THE INVENTION

The present invention relates generally to microelectromechanical systems (MEMS) devices. More specifically, the present invention relates to a MEMS inertial sensor device with integrated top and bottom electrodes and a method of fabrication.

BACKGROUND OF THE INVENTION

Microelectromechanical systems (MEMS) technology provides a way to make very small mechanical structures and integrate these structures with electrical devices on a single substrate using conventional batch semiconductor processing techniques. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems. MEMS sensor devices includes inertial sensors such as accelerometers and gyro sensors. In particular, MEMS accelerometers and gyro sensors are increasingly being used in the automotive industry, such as in airbag controls, to facilitate antiskid control, electronic stability control in anti-rollover systems, and so forth. An accelerometer senses linear acceleration along one or more axes and a gyro sensor, alternatively referred to as a "gyroscope" or "angular rate sensor," senses angular speed or velocity around one or more axes.

SUMMARY

Aspects of the disclosure are defined in the accompanying claims.

In a first aspect, there is provided a device comprising: a substrate; a first electrode formed on the substrate; a structural layer formed on the substrate, the structural layer including a movable mass and a fixed portion, the movable mass being suspended above the substrate and the first electrode being interposed between the substrate and the movable mass; a second electrode spaced apart from an upper surface of the movable mass by a gap; and an anchor coupling the second electrode to the fixed portion of the structural layer.

In a second aspect, there is provided a method of fabricating a sensor device comprising: forming a first electrode on a substrate; forming a first sacrificial layer over the first electrode; forming a structural layer on the first sacrificial layer, the structural layer including a movable mass and a fixed portion; forming a second sacrificial layer over the structural layer; etching a first opening in the second sacrificial layer to reveal a first section of the fixed portion of the structural layer; forming a second electrode on the second sacrificial layer; forming an anchor in the first opening to couple the second electrode to the fixed portion of the structural layer; and removing the first and second sacrificial layers such that the movable mass is suspended above the substrate, the first electrode is interposed between the substrate and the movable mass, and the second electrode is spaced apart from an upper surface of the movable mass by a gap.

In a third aspect, there is provided a device comprising: a substrate having a planar surface; a first electrode formed on the substrate; a structural layer formed on the substrate from a first electrically conductive material, the structural layer including a movable mass and a fixed portion, the movable mass being suspended above the substrate and the first electrode being interposed between the substrate and the movable mass; a second electrode spaced apart from an upper surface of the movable mass by a gap, wherein the first and second electrodes are aligned with one another in a direction perpendicular to the planar surface of the substrate and the movable mass is located between the first and second electrodes; an anchor coupling the second electrode to a first section of the fixed portion of the structural layer; and a connection element electrically connecting the second electrode to the second section of the fixed portion of the structural layer, the first and second sections of the fixed portion being electrically isolated from the movable mass.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a microelectromechanical systems (MEMS) device, such as an inertial sensor, and methodology for fabricating the MEMS device. The MEMS sensor device has both top and bottom electrodes integrated into the structure. More particularly, the top electrode is integrated with the MEMS wafer containing the bottom electrode and a structural layer. The bottom electrode may be defined by a bottom polysilicon layer, while the top electrode may be formed by a polysilicon overhanging structure positioned above a movable mass. The top electrode is anchored on a fixed portion of the structural layer with or without electrical connection. Such a configuration can enable differential sensing of out-of-plane sense motion of the movable mass in, for example, an angular rate sensor or an accelerometer design. In an angular rate sensor design, the top and bottom electrodes may be used as sense electrodes and/or as quadrature compensation electrodes to yield increased angular rate sensitivity and/or increased quadrature compensation range. Moreover, balanced top and bottom electrodes may eliminate the sensitivity of an angular rate sensor to linear acceleration.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
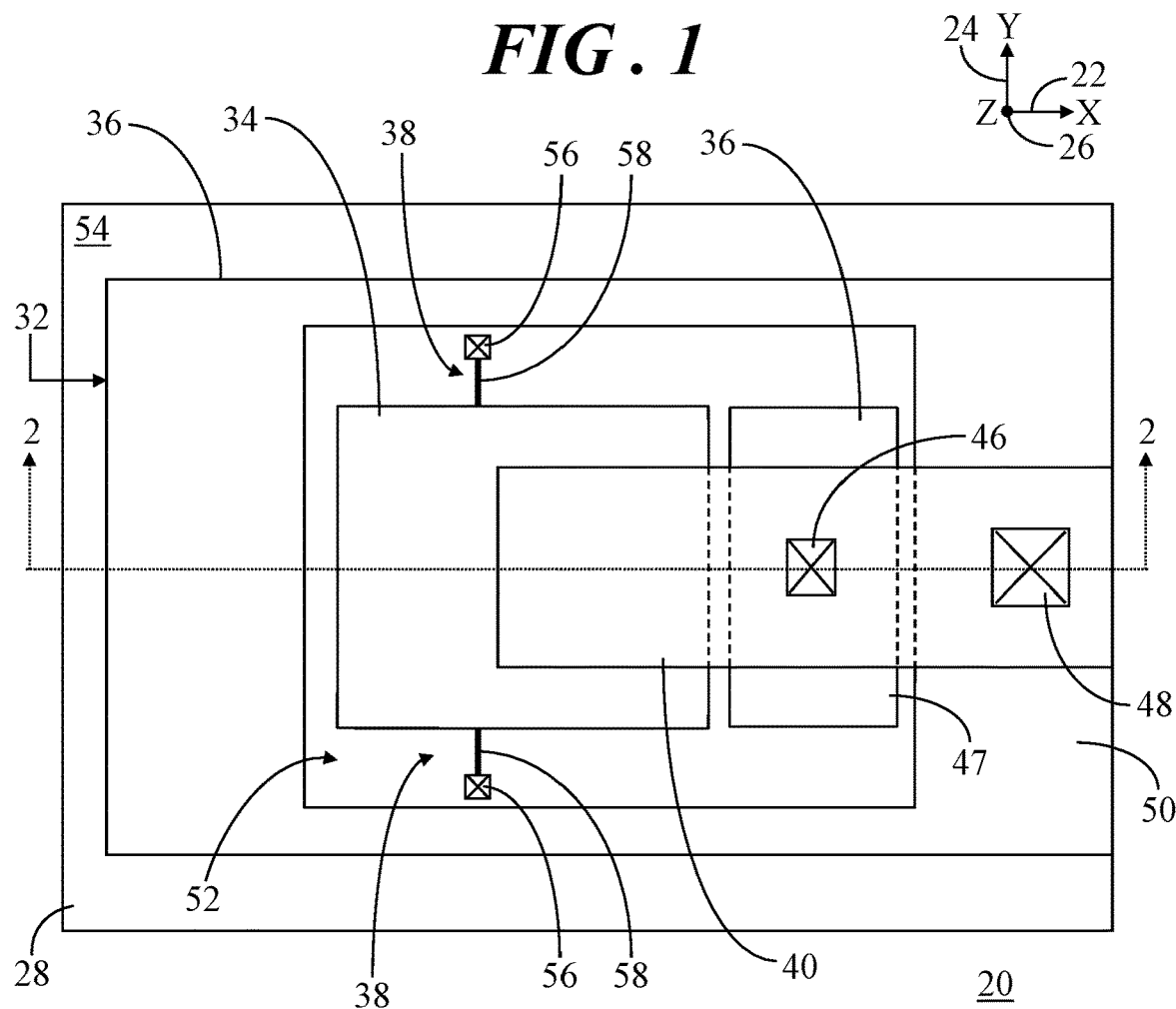
FIG. 1 shows in a simplified and representative form a top view of a sensor device in accordance with an embodiment.
Figure 2:
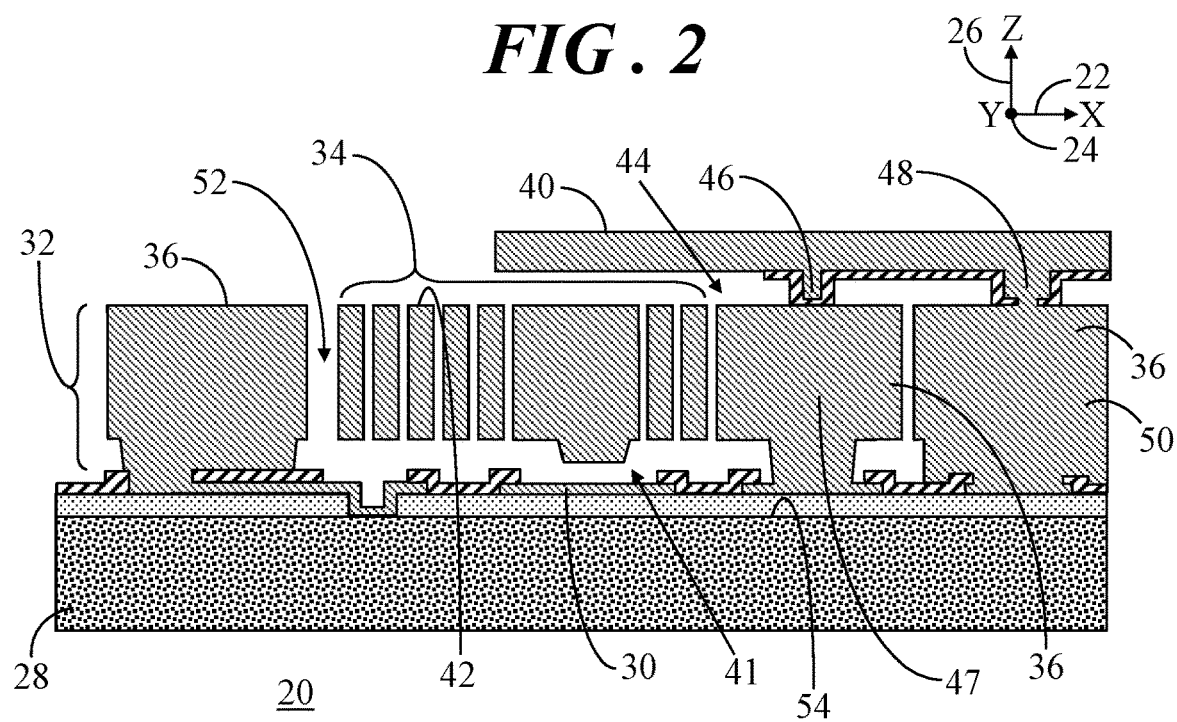
FIG. 2 shows a side sectional view of the sensor device along section line 2-2 of FIG. 1.

Referring to FIGS. 1 and 2, FIG. 1 shows in a simplified and representative form a top view of a sensor device 20 in accordance with an embodiment and FIG. 2 shows a side sectional view of sensor device 20 along section line 2-2 of FIG. 1. Sensor device 20 may be an angular rate sensor configured to sense angular rate about one or more an axes of rotation in a three-dimensional coordinate system. By conventional, sensor device 20 is illustrated as having a generally planar structure within an X-Y plane, in which an X-axis 22 extends rightward and leftward in FIG. 1, a Y-axis 24 extends upward and downward in FIG. 1, and a Z-axis 26 extends out of the page in FIG. 1 (and Z-axis 26 extends upward and downward in FIG. 2). Although an angular rate sensor is generally described herein, it should be understood that sensor device 20 may be another inertial sensor design configured for out-of-plane sensing, such as an accelerometer.

Sensor device 20 includes a substrate 28 and a first electrode, referred to herein as a bottom electrode 30 (visible in FIG. 2), formed on substrate 28. A structural layer 32 is formed on substrate 28. Structural layer 32 includes a movable mass 34 and a fixed portion 36. Fixed portion 36 is coupled to substrate 28 and movable mass 34 is suspended above substrate 28 by a spring system 38 (shown in highly simplified form in FIG. 1). Bottom electrode 30 is interposed between substrate 28 and movable mass 34. Further, movable mass 34 is spaced apart from bottom electrode 30 by a gap 41 having a predefined width. A second electrode, referred to herein as a top electrode 40, is spaced apart from an upper surface 42 of movable mass 34 by a gap 44 and an anchor 46 interconnects top electrode 40 with fixed portion 36 of structural layer 32. Thus, top electrode 40 is formed as an overhanging structure above movable mass 34.

For consistency and as illustrated in FIG. 1, any connection structures, such as anchor 46, that connect an element of sensor device 20 to another element of sensor device 20 is depicted by a block with an "X" extending through. For example, anchor 46 couples top electrode 40 to a first section 47 of fixed portion 36. Further, although a single bottom electrode 30 and a single top electrode 40 are discussed herein, sensor device 20 may include more than one of each of bottom and top electrodes 30, 40 in accordance with a particular design configuration.

In some embodiments, sensor device 20 further includes a connection element 48 electrically connecting top electrode 40 and a second section 50 of fixed portion 36, in which second section 50 may be electrically isolated from movable mass 34. Connection element 48 may be utilized for receipt of a sense signal from top electrode 40 or for providing a corrective voltage to top electrode 40, as will be discussed in greater detail below. In other embodiments, connection element 48 need not be provided.

In some embodiments, section 50 of fixed portion 36 may additionally be electrically isolated from first section 47 of fixed portion 36. Further, first section 47 of fixed portion 36 may be electrically isolated from movable mass 34 and from anchor 46. First section 47 and other electrodes (not shown) may function as a drive electrodes for enabling oscillatory motion of movable element 34 along X-axis 22 (discussed below). Alternatively, in a multiple axis sensing design, first section 47 may function as a lateral electrode for sensor device 20 that is configured to sense lateral movement of movable element 34 along, for example, X-axis 22. In other embodiments, first section 47 configured as an electrode need not be provided. In still other embodiments, connection element 48 may be configured to serve as both electrical connection and as an anchor for second electrode 40 so that anchor 46 need not be provided.

In the simplified illustrated configuration, fixed portion 36 with second section 50 is in the form of a frame surrounding an opening 52 in which movable mass 34 and first section 47 reside. Additionally, movable mass 34 may be attached to and suspended above a planar surface 54 of substrate 28 by spring system 38 which may include anchor elements 56 coupled to planar surface 54 and torsion springs 58 interconnecting movable mass 34 with anchor elements 56. Torsion springs 58 may enable movable mass 34 to pivot about an axis of rotation coinciding with Y-axis 24 in this example, such that movable mass 34 moves out-of-plane along Z-axis 26 in response to a physical stimulus (discussed below). The shape, size, quantity, locations, material, and spring constants of torsion springs 58 can be suitably selected in accordance with known mechanical design principles to achieve the desired stiffness for frequency matching, stability, and sensing range. Further, although movable mass 34 is shown anchored to substrate 28, in alternative configurations, movable mass 34 may be flexibly coupled to fixed portion 36. Still further, a sensor device may be configured with more than one movable mass in alternative configurations. Additionally, the movable mass, the fixed portion, and the bottom and top electrodes may have a great variety of shapes, sizes, and relative locations.

In general, bottom and top electrodes 30, 40 are immovable relative to movable mass 34. Further, bottom and top electrodes 30, 40 may be aligned with one another in a direction (e.g., along Z-axis 26) perpendicular to planar surface 54 of substrate 28 with movable mass 34 being located between bottom and top electrodes 30, 40. Accordingly, bottom and top electrodes 30, 40 may be configured as a differential electrode pair for detecting or sensing the displacement of movable mass 34 along Z-axis 26 in response to a physical stimulus (e.g., acceleration or angular velocity). The implementation of differential sensing utilizing bottom and top electrodes 30, 40 may effectively increase the sensitivity of sensor device 20 relative to prior art designs that include, for example, only top or bottom electrodes.

In an angular rate sensor design, movable mass 34 may be configured to undergo oscillatory motion within the X-Y plane. For example, an alternating current (AC) voltage may be applied to a drive system (not shown) of sensor device 20 to cause movable mass 34 to move generally parallel to a drive axis (in this example, X-axis 22). As a result of a Coriolis acceleration component, spring system 38 enables movable mass 34 to oscillate out of the X-Y plane, along the sense axis (in this example, Z-axis 26) as a function of angular rotation rate, i.e., the angular velocity, of sensor device 20 about an input axis (in this example, Y-axis 24). The movement of movable mass 34 along Z-axis 26 has an amplitude that is proportional to the angular rotation rate of sensor device 20 about the sense axis.

In some embodiments, bottom and top electrodes 30, 40 are configured to sense this Coriolis acceleration component so that angular velocity can be determined. In other embodiments, bottom and top electrodes 30, 40 may alternatively or additionally be provided for frequency tuning, force feedback, and/or quadrature compensation. Quadrature motion is the motion of movable mass 34 along the sense axis, e.g., Z-axis 26, resulting from the oscillatory drive motion along the drive axis, X-axis 22. Thus, in some embodiments, a corrective voltage can be provided by circuitry associated with sensor device 20 and is received at bottom and top electrodes 30, 40. This corrective voltage may be used to compensate for, or otherwise, cancel the quadrature motion. The implementation of both bottom and top electrodes, e.g., bottom and top electrodes 30, 40, may effectively increase the quadrature compensation range of sensor device 20 relative to prior art designs that include, for example, only top or only bottom electrodes.

In X- or Y-axis angular rate sensors that contain only top or only bottom electrodes, linear acceleration along Z-axis 26 causes a change in the gap width between the movable mass and the electrode, thus causing frequency changes that can adversely affect the sensitivity of the angular rate sensor. The aligned and balanced bottom and top electrodes 30, 40 of sensor device 20 may largely eliminate the sensitivity of sensor device 20 to linear acceleration, thereby further increasing the sensitivity of sensor device 20 relative to prior art designs that include, for example, only top or only bottom electrodes.

Figure 3:
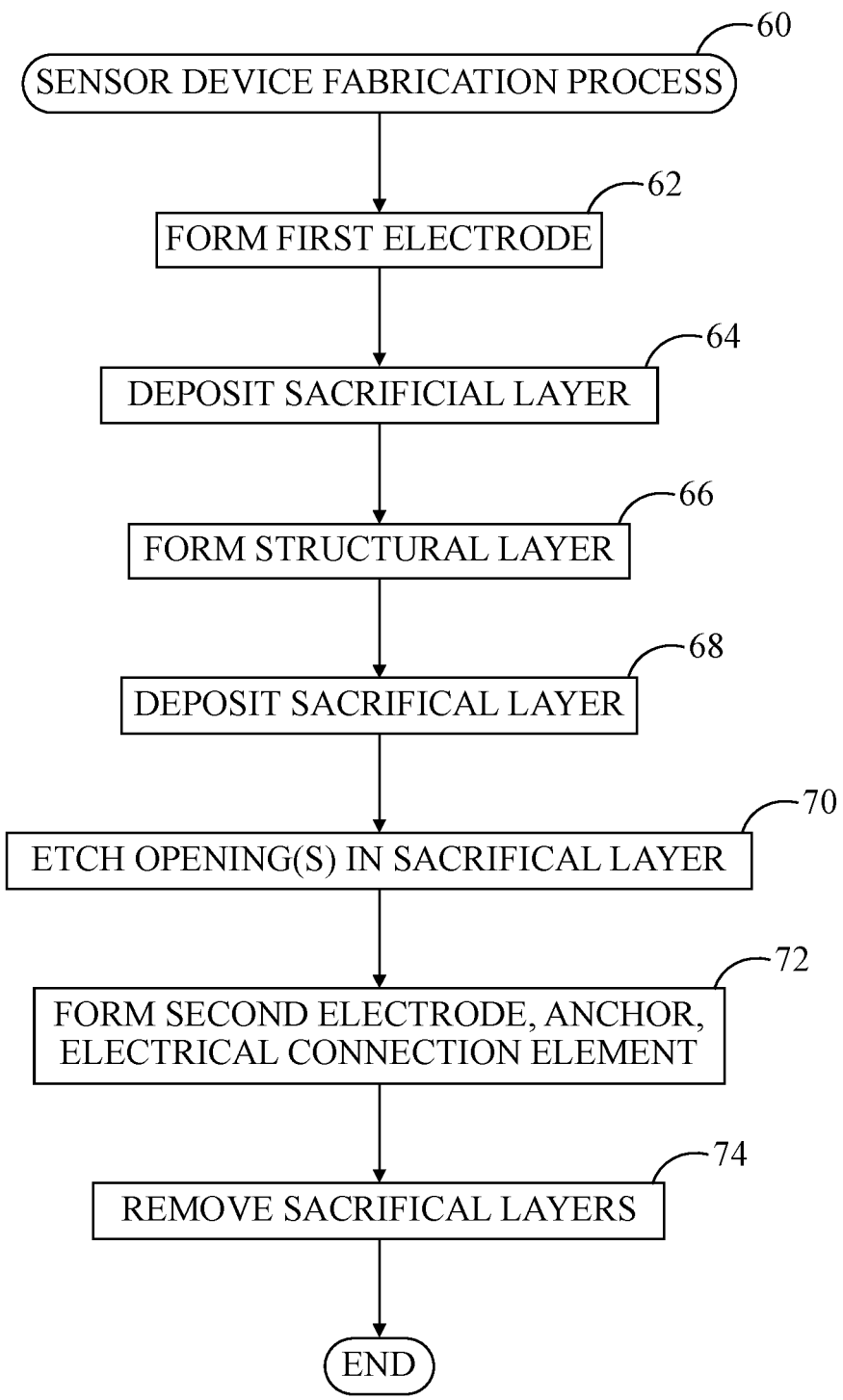
FIG. 3 shows a flowchart of a sensor device fabrication process in accordance with another embodiment.

FIG. 3 shows a flowchart of a sensor device fabrication process 60 in accordance with another embodiment. Sensor device fabrication process 60 is implemented to form a sensor device having both top and bottom electrodes. For simplicity of discussion, process 60 is described in connection with fabricating sensor device 20 (FIG. 2) having bottom and top electrodes 30, 40. Thus, reference may be made concurrently to FIG. 2 during the ensuing discussion. However, sensor device fabrication process 60 may be adapted for the manufacture of a wide variety of sensor devices that include both top and bottom electrodes. Sensor device fabrication process 60 provides generalized process blocks performed to yield sensor device 20. Further details will be provided in connection with processing stages described in connection with FIGS. 4-11.

Prior art designs sometimes include a cap wafer or structure to achieve a configuration having top and bottom electrodes. In such a configuration, the bottom electrodes may be formed on a substrate below a movable mass and the top electrodes may be formed on a cap wafer that is subsequently bonded to the substrate so that the movable mass can be interposed between the bottom and top electrodes. Such designs suffer from various problems. For example, the gap width between the top electrode(s) and the movable mass can be difficult to control by bonding. Additionally, the alignment of bottom and top electrodes can be difficult to control by bonding. Inadequately controlled gap size and alignment error can effectively decrease the sensitivity of such a sensor device. Methodology described herein enables the integration of top electrodes in a sensor device process flow of a device wafer. Accordingly, a cap wafer containing top electrodes is not needed and the problems associated with inadequately controlled gap size and alignment error can be avoided.

The general process operations of sensor device fabrication process 60 entail a block 62 at which at least one first electrode (e.g., bottom electrode 30) is formed on a substrate (e.g., substrate 28). At a block 64, a first sacrificial layer is formed or otherwise deposited over the first electrode. At a block 66, a structural layer (e.g., structural layer 32) is formed on the first sacrificial layer. The structural layer includes at least one movable mass (e.g., movable mass 34) and at least one fixed portion (e.g., fixed portion 36). At a block 68, a second sacrificial layer is formed or otherwise deposited over the structural layer.

At a block 70, openings are etched in the second sacrificial layer. At a block 72, at least one second electrode (e.g., top electrode 40) is formed, at least one anchor (e.g., anchor 46) is formed in one of the openings, and when used, at least one electrical connection element (e.g., connection element 48) is formed in another of the openings. At a block 74, the first and second sacrificial layers are removed such that the movable mass is suspended above the substrate, the first electrode is interposed between the substrate and the movable mass, and the second electrode is spaced apart from an upper surface (e.g., upper surface 42) of the movable mass by a gap (e.g., gap 44). Thereafter, sensor fabrication process 60 ends with a top electrode integrated into the process flow of a sensor device wafer. Of course, those skilled in the art will recognize that additional process operations may occur following the removable of the first and second sacrificial layers. These process blocks may entail uniquely marking the sensor devices, singulation to form individual sensor devices, inspection, test, packaging, and the like.

Figure 4:
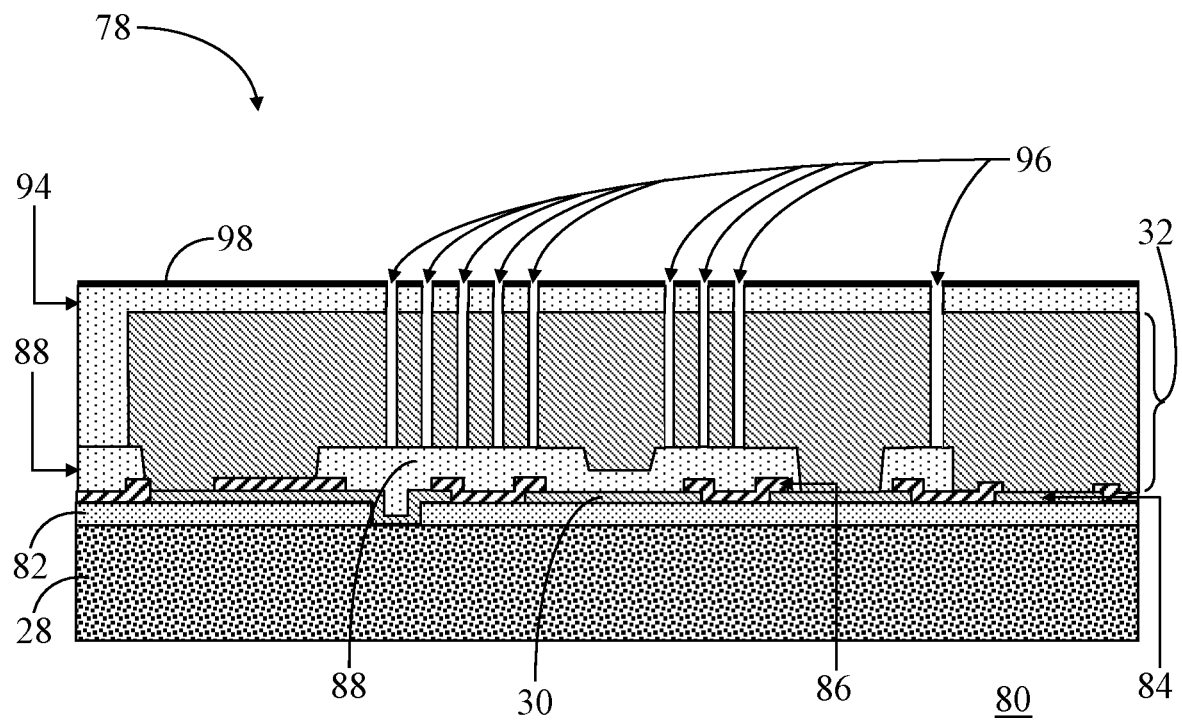
FIG. 4 shows a side sectional view of a semiconductor wafer at an intermediate stage of processing to fabricate the sensor device of FIGS. 1-2 in accordance with the sensor device fabrication process of FIG. 3.

FIG. 4 shows a side sectional view of a wafer 78 at an intermediate stage 80 of processing to form sensor device 20 (FIGS. 1-2) in accordance with sensor device fabrication process 60 (FIG. 3). FIG. 4 and subsequent FIGS. 5-11 demonstrate the fabrication of a single sensor device 20 for simplicity of illustration. Accordingly, only a very small portion of wafer 78 is represented in FIGS. 4-11. It should be understood, however, that a multiplicity of sensor devices 20 may be fabricated on a single semiconductor wafer, such as wafer 78, during processing.

As shown at intermediate stage 80, substrate 28 may be covered by one or more insulation layers 82 (one shown). Insulation layer 82 may include glass, silicon dioxide, silicon nitride, or any other compatible material. An (initial) electrically conductive material 84 has been deposited over insulation layer. Conductive material 84 may be for example, an initial polysilicon deposition layer deposited on insulation layer 82. Conductive material 84 may be suitably patterned and etched to form bottom electrode 30 in conjunction with other fixed components of sensor device. An insulation layer, such as a nitride deposition layer 86, may then be formed over conductive material 84. Nitride deposition layer 86 has also been suitably patterned and etched so that bottom electrode 30 is exposed from nitride deposition layer 86.

A first sacrificial layer 88 has been formed over nitride deposition layer 86 and over the exposed portions of conductive material 84, including bottom electrode 30. First sacrificial layer 88 has also been suitably patterned and etched to expose portions of conductive material 84 and nitride deposition layer 86. Structural layer 32 has been formed from another (a first) electrically conductive material 92 (e.g., another polysilicon deposition layer) over first sacrificial layer 88 and over any exposed portions of conductive material 84 and nitride deposition layer 86. It can be observed in FIG. 4 that first sacrificial layer 88 underlies a portion of structural layer 32. Thereafter, a second sacrificial layer 94 has been formed or otherwise deposited over structural layer 90.

As particularly shown at stage 80, an etch process has been performed to form narrow trenches 96 extending through second sacrificial layer 94 and structural layer 90. That is, a mask 98 may be formed over second sacrificial layer 94 and suitably patterned with openings extending through it. Trenches 96 may then be formed by implementing, for example, a deep reactive-ion etching (DRIE) process. DRIE is a highly anisotropic etch process used to create deep penetration, steep-sided holes and trenches, typically with high aspect ratios. DRIE can produce narrow trenches 96 that are, for example, 1.5 microns wide. These narrow trenches and/or holes may be utilized in later process operations to remove first sacrificial layer 88 from below movable mass 34 (FIG. 2) of structural layer 32. It should be understood that other suitable etch processes may alternatively be implemented.

Figure 5:
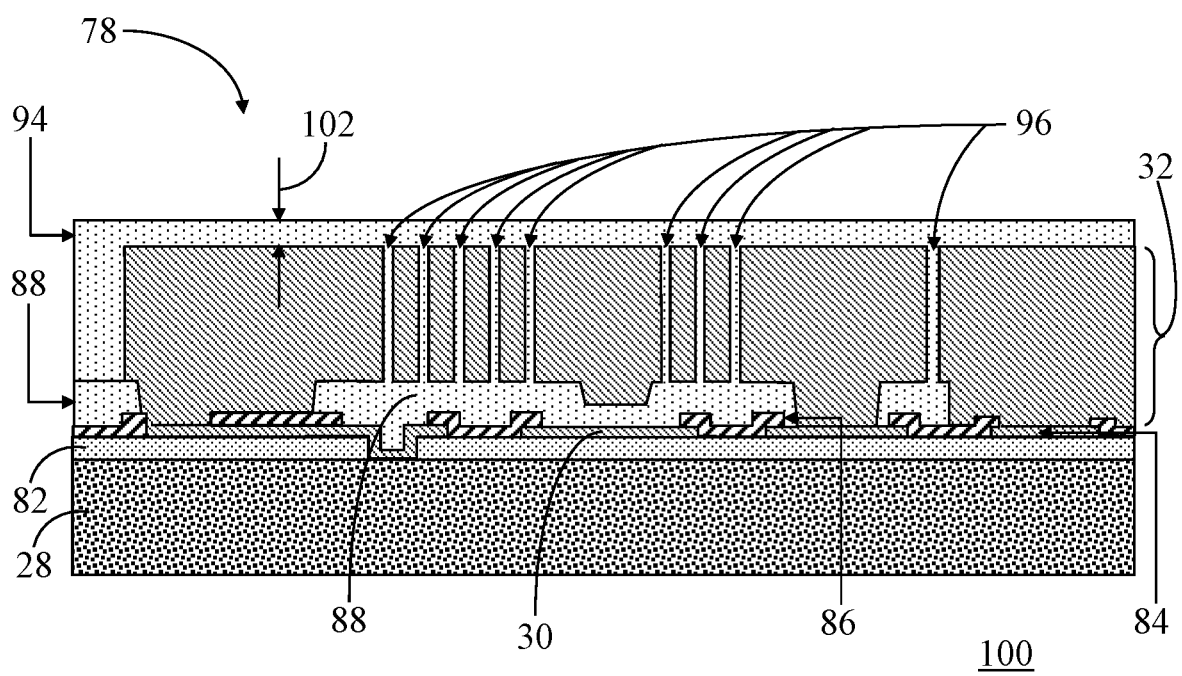
FIG. 5 shows a side sectional view of the wafer of FIG. 4 at a subsequent stage of processing.

FIG. 5 shows a side sectional view of wafer 78 of FIG. 4 at a subsequent stage 100 of processing. At stage 100, mask 98 (FIG. 4) is removed, trenches 96 are refilled using, for example, a low-pressure chemical vapor deposition (LPCVD) process. LPCVD is performed at sub-atmospheric pressures that tend to reduce unwanted gas-phase reactions and improve film uniformity across wafer 78. It some configurations, trenches 96 may be refilled with an oxide material, such as silicon dioxide. It should be understood that other suitable trench refill processes may alternatively be implemented. Further, at stage 100, second sacrificial layer 94 above structural layer 32 may be suitably thinned to define a width 102 of gap 44 (FIG. 2).

Figure 6:
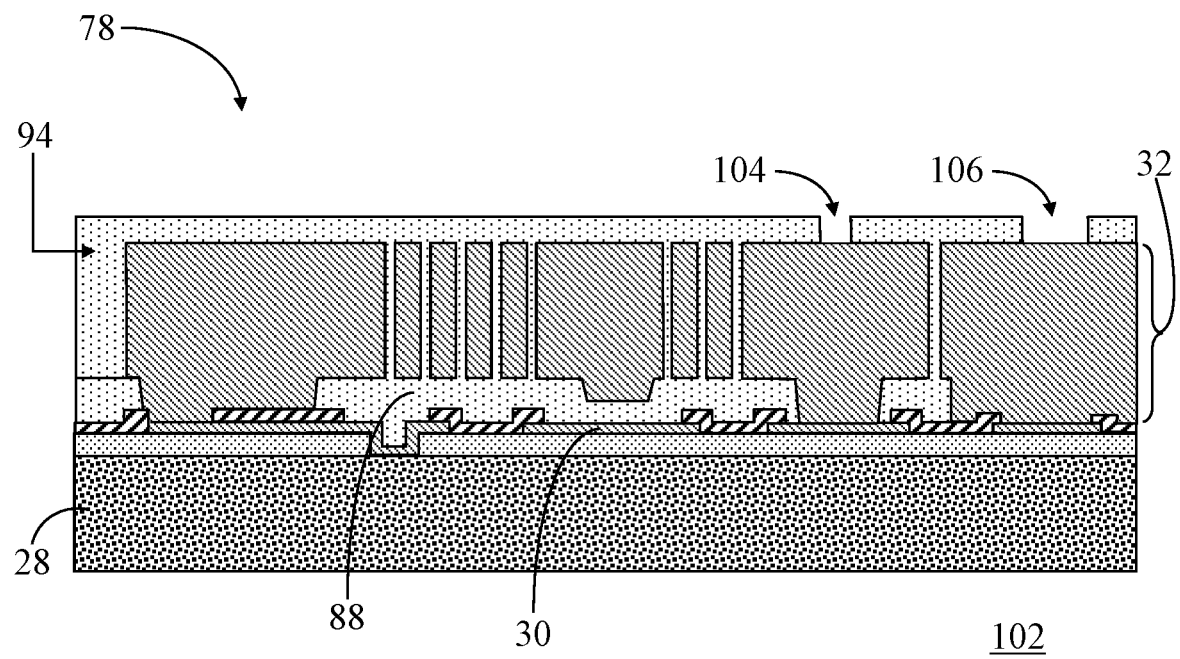
FIG. 6 shows a side sectional view of the wafer of FIG. 5 at a subsequent stage of processing.

FIG. 6 shows a side sectional view of wafer 78 of FIG. 5 at a subsequent stage 102 of processing. At stage 102, second sacrificial layer 94 undergoes an etch process (e.g., an oxide etch process) to form a first opening 104 for anchor 46 (FIG. 2) and a second opening 106 for connection element 48 (FIG. 2) extending through sacrificial layer 94 and exposing a portion of structural layer 32.

Figure 7:
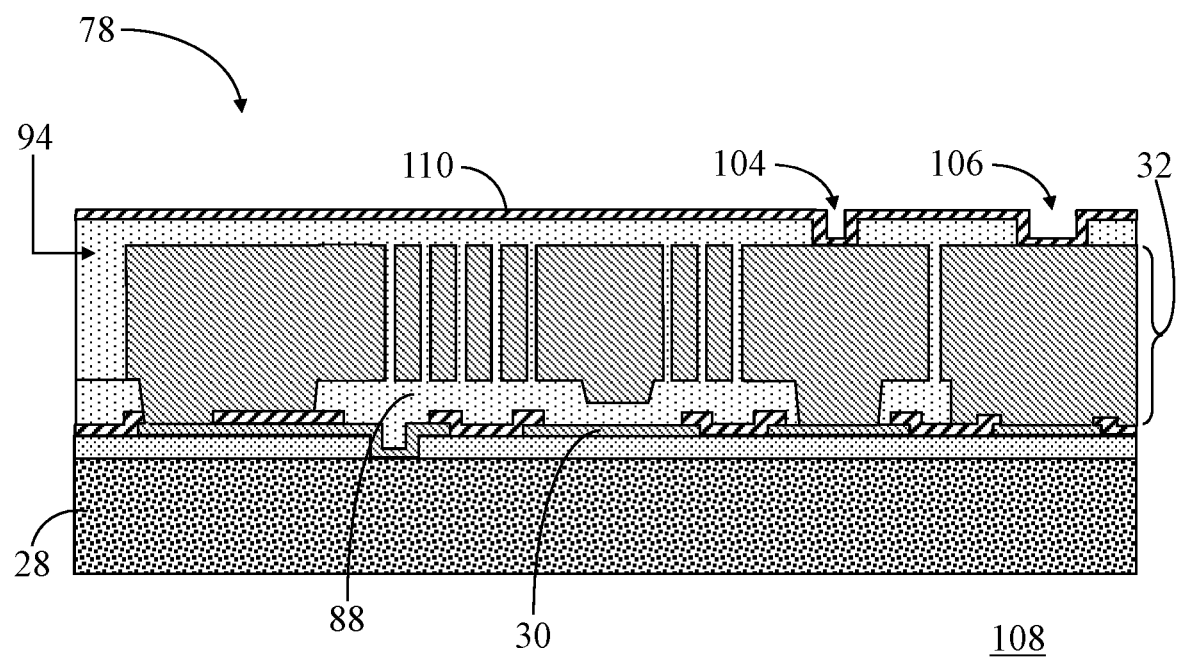
FIG. 7 shows a side sectional view of the wafer of FIG. 6 at a subsequent stage of processing.

FIG. 7 shows a side sectional view of wafer 78 of FIG. 6 at a subsequent stage 108 of processing. At stage 108, an electrically insulating layer 110, e.g. a nitride, has been deposited over second sacrificial layer 98 and into first and second openings 104, 106, Electrically insulating layer 110 may effectively cover sidewalls and the bottoms of each of first and second openings 104, 106.

Figure 8:
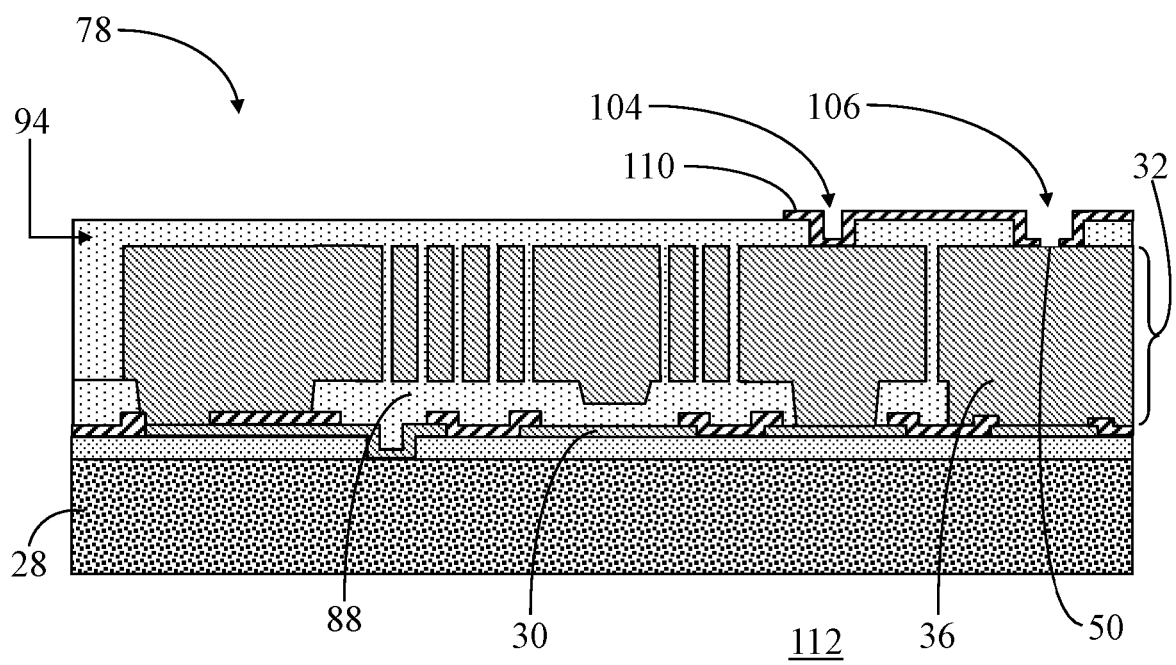
FIG. 8 shows a side sectional view of the wafer of FIG. 7 at a subsequent stage of processing.

FIG. 8 shows a side sectional view of wafer 78 of FIG. 7 at a subsequent stage 112 of processing. At stage 112, electrically insulating layer 110 is suitably etched to remove a portion of layer 110 overlying second sacrificial layer 94. Further, insulating layer 110 is etched away from the bottom of second opening 106 to reveal section 50 of fixed portion 36 of the electrically conductive structural layer 32.

Figure 9:
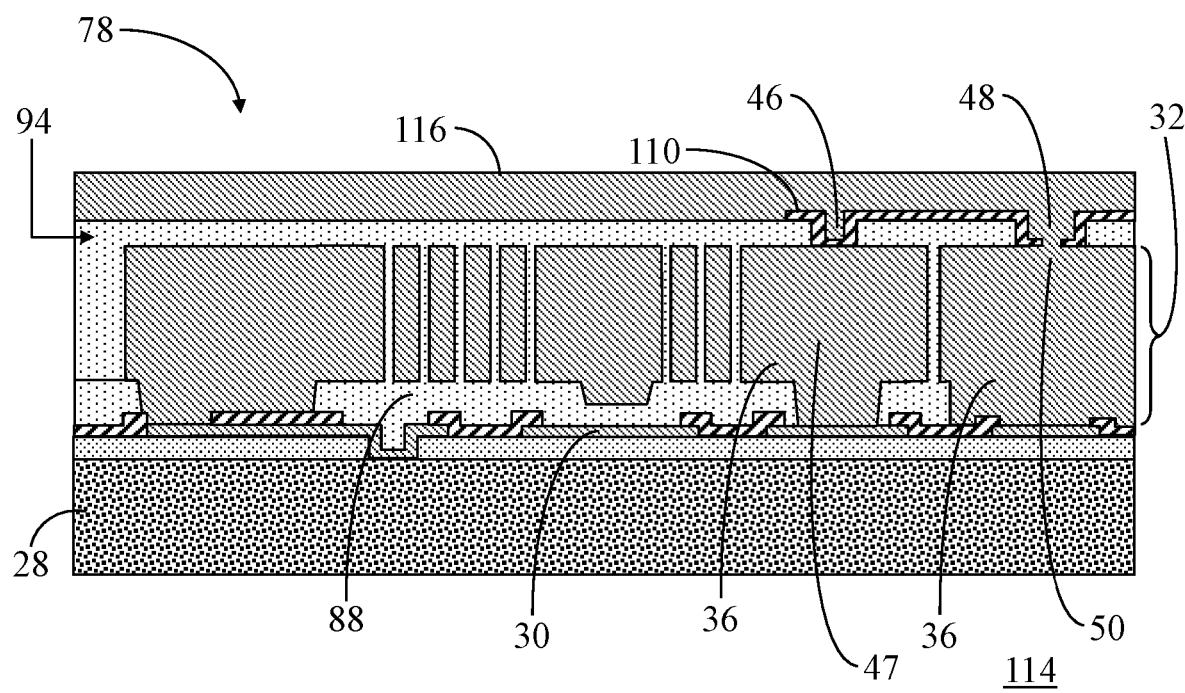
FIG. 9 shows a side sectional view of the wafer of FIG. 8 at a subsequent stage of processing.

FIG. 9 shows a side sectional view of wafer 78 of FIG. 8 at a subsequent stage 114 of processing. At stage 114, another (e.g., a second) electrically conductive layer 116 is deposited over second sacrificial layer 94. Electrically conductive layer 116, e.g., a second polysilicon deposition layer, fills first opening 104 to form anchor 46 and fills second opening 106 to form connection element 48. Electrically insulating layer 110 deposited in opening 104 prior to deposition of conductive layer 116 is thus interposed between anchor 46 and first section 47 of fixed portion 36 of structural layer 32. As such, electrically insulating layer 110 electrically isolates anchor 46 from the underlying structural layer 32. However, since second section 50 of fixed portion 36 was revealed in the prior etching process demonstrated at stage 112 (FIG. 8), conductive layer 116 deposited in second opening 106 electrically interconnects section 50 of fixed portion 36 of structural layer 32 with conductive layer 116.

Figure 10:
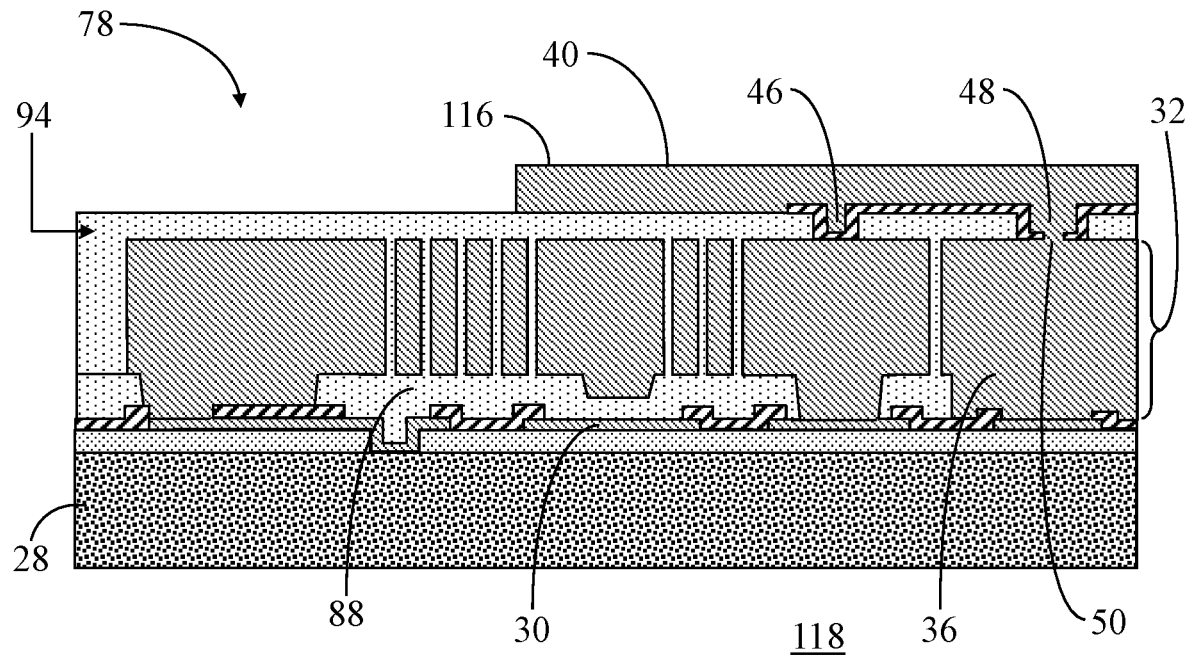
FIG. 10 shows a side sectional view of the wafer of FIG. 9 at a subsequent stage of processing.

FIG. 10 shows a side sectional view of wafer 78 of FIG. 9 at a subsequent stage 118 of processing. At stage 118, electrically conductive layer 116 has been suitably etched to define top electrode 40.

Figure 11:
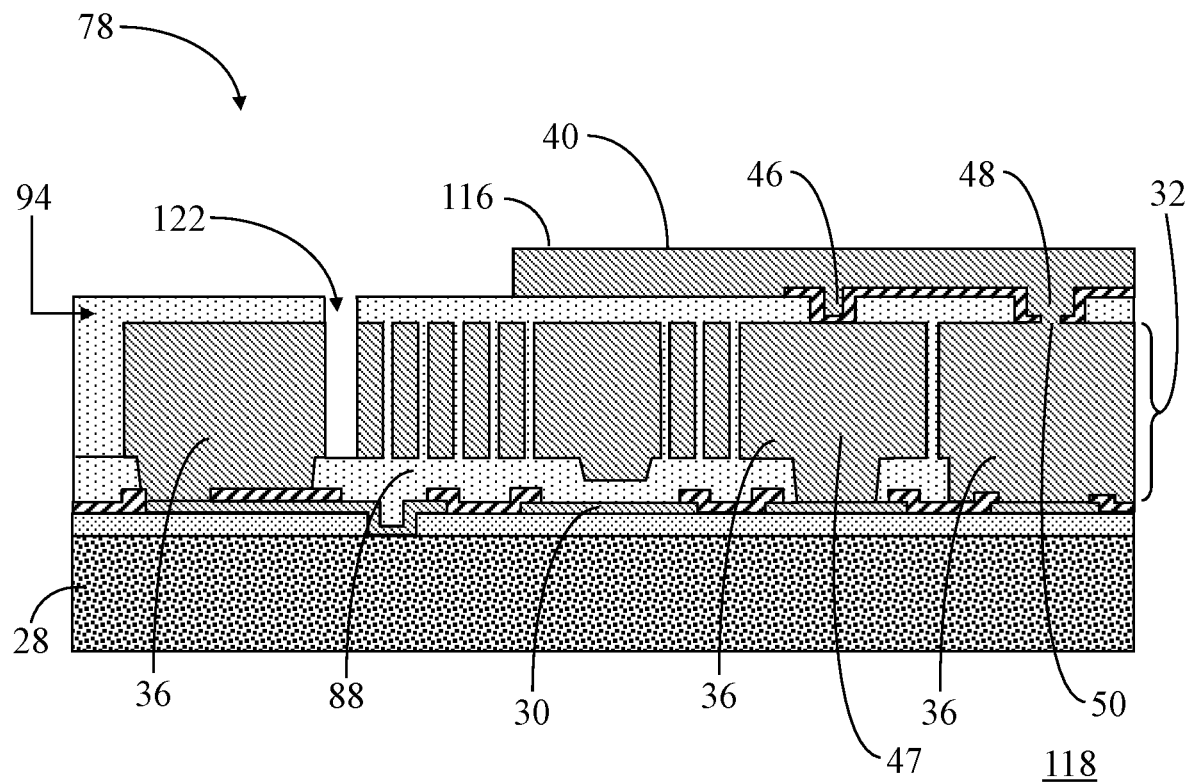
FIG. 11 shows a side sectional view of the wafer of FIG. 10 at a subsequent stage of processing.

FIG. 11 shows a side sectional view of wafer 78 of FIG. 10 at a subsequent stage 120 of processing. At stage 120, relatively wide trenches 122 may then be formed by implementing, for example, a DRIE process. Accordingly, the etch processes demonstrated at stage 80 (FIG. 4) and stage 120 (FIG. 11) yield movable element 34 and fixed portion 36 (including first and second sections 47, 50) in structural layer 32. Thereafter, first and second sacrificial layers 88, 94 may be removed by conventional processes to release movable element 34, to form gap 41 between bottom electrode 30 and movable mass 34, and to form gap 44 between upper surface 42 of movable mass 34 and top electrode 30, as shown in FIG. 2.

Thus, the methodology summarized in connection with FIG. 3 and demonstrated in processing stages of FIGS. 4-11, yields a sensor device configuration having both bottom and top electrodes for out-of-plane sensing and/or out-of-plane quadrature compensation. Further, the methodology enables the integration of top electrodes in a sensor device process flow of a device wafer to achieve controlled gap sizes and avoid alignment errors.

Embodiments described herein entail a sensor device having both bottom and top electrodes integrated into the structure and a method of fabricating the sensor device. The sensor device has both top and bottom electrodes integrated into the structure. The bottom electrode may be defined by a bottom polysilicon layer, while the top electrode may be formed by a polysilicon overhanging structure positioned above a movable mass. The top electrode is anchored to a fixed portion of the structural layer with or without electrical connection. Such a configuration can enable differential sensing of out-of-plane sense motion of the movable mass in, for example, an angular rate sensor or an accelerometer design. In an angular rate sensor design, the top and bottom electrodes may be used as sense electrodes and/or quadrature compensation electrodes to yield increased angular rate sensitivity and/or increased quadrature compensation range. Moreover, balanced top and bottom electrodes may eliminate the sensitivity of an angular rate sensor to linear acceleration.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device comprising:
   a substrate;
   a first electrode formed on the substrate;
   a structural layer formed on the substrate from a first electrically conductive material, the structural layer including a movable mass and a fixed portion, the movable mass being suspended above the substrate and the first electrode being interposed between the substrate and the movable mass and separated from the movable mass by a first gap;
   a second electrode formed on the substrate above the structural layer, wherein the second electrode is spaced apart from an upper surface of the movable mass by a second gap; and wherein the second electrode and the anchor are formed from a monolithic segment of second electrically conductive material;
   an anchor disposed between the second electrode and the fixed portion of the structural layer wherein the anchor is coupled to the second electrode and the fixed portion of the structural layer, thereby coupling the second electrode to the fixed portion of the structural layer; and
   an electrically insulating material interposed between the anchor and the fixed portion.

2. The device of claim 1 wherein the first and second electrodes are immovable relative to the movable mass.

3. The device of claim 1 wherein:
   the substrate has a planar surface;
   the first and second electrodes are aligned with one another in a direction perpendicular to the planar surface of the substrate; and
   the movable mass is located between the first and second electrodes.

4. The device of claim 3 wherein the movable mass is configured for displacement along a first axis perpendicular to the planar surface of the substrate in response to a physical stimulus, and the first and second electrodes are configured as a differential electrode pair for detecting the displacement of the movable mass along the first axis.

5. The device of claim 3 wherein:
   the movable mass is configured to undergo oscillatory drive motion relative to a drive axis that is substantially parallel to the planar surface and the movable mass is further configured to undergo oscillatory sense motion along a sense axis perpendicular to the planar surface of the substrate in response to an angular velocity about an input axis that is perpendicular to each of the drive and sense axes; and
   the first and second electrodes are configured to receive a corrective voltage, the corrective voltage being configured to compensate for a quadrature motion of the movable mass along the sense axis resulting from the oscillatory drive motion along the drive axis.

6. The device of claim 1 wherein:
   the structural layer is formed from a first electrically conductive material;
   at least a section of the fixed portion of the structural layer is electrically isolated from the movable mass; and
   the device further comprises a connection element electrically connecting the second electrode and the section of the fixed portion of the structural layer.

7. The device of claim 1 wherein:
   the first electrically conductive material comprises a first polysilicon deposition layer;
   the second electrically conductive material comprises a second polysilicon deposition layer; and
   the electrically insulating material comprises a nitride deposition layer.

8. The device of claim 7 wherein the first electrode is formed from an initial electrically conductive material, the initial electrically conductive material comprising an initial polysilicon deposition layer deposited on the substrate.

9. A method of fabricating a sensor device comprising:
   forming a first electrode on a substrate;
   forming, on the substrate from a first electrically conductive material, a first sacrificial layer over the first electrode;
   forming, on the substrate, a structural layer on the first sacrificial layer, the structural layer including a movable mass and a fixed portion;
   forming, on the substrate, a second sacrificial layer over the structural layer;
   etching a first opening in the second sacrificial layer to reveal a first section of the fixed portion of the structural layer;
   forming, on the substrate, a second electrode on the second sacrificial layer;
   forming, on the substrate, an anchor in the first opening to couple the second electrode to the fixed portion of the structural layer, wherein the second electrode and the anchor are formed from a monolithic segment of second electrically conductive material; and
   removing the first and second sacrificial layers such that the movable mass is suspended above the substrate, the first electrode is interposed between the substrate and the movable mass and separated from the first electrode by a first gap, and the second electrode is spaced apart from an upper surface of the movable mass by a second gap;
   wherein an electrically insulating material interposed between the anchor and the fixed portion.

10. The method of claim 9 wherein:
    forming the structural layer comprises depositing a first electrically conductive material over the first sacrificial layer and etching the first electrically conductive material to define the movable mass and the fixed portion; and
    forming the second electrode comprises depositing a second electrically conductive material over the second sacrificial layer and etching the second electrically conductive material to define the second electrode.

11. The method of claim 10 wherein the forming the anchor comprises:
    forming an electrically insulating material in the first opening prior to depositing the second electrically conductive material; and
    depositing the second electrically conductive material comprises filling the first opening with the second electrically conductive material to form the anchor, wherein the electrically insulating material is interposed between the anchor and the fixed portion.

12. The method of claim 9 further comprising:
etching a second opening in the second sacrificial layer to reveal a second section of the fixed portion of the structural layer, the second section being electrically isolated from the movable mass; and
forming a connection element in the second opening, the connection element electrically connecting the second electrode and the second section of the fixed portion of the structural layer.

13. The method of claim 12 wherein the depositing the second electrically conductive material comprises filling the second opening with the second electrically conductive material to form the connection element.

14. The method of claim 9 further comprising:
etching a second opening in the second sacrificial layer to reveal a second section of the fixed portion of the structural layer, the second section being electrically isolated from the movable mass;
depositing an electrically insulating material over the second sacrificial material;
selectively removing the electrically insulating material such that the electrically insulating material remains lining the first opening and is at least partially removed from the second opening;
depositing a second electrically conductive layer over the second sacrificial layer, wherein the second electrically conductive material fills the first opening to form the anchor, and the second electrically conductive material fills the second opening to form a connection element; and
forming the second electrode comprises etching the second electrically conductive material to define the second electrode, wherein the connection element in the second opening electrically connects the second electrode and the second section of the fixed portion of the structural layer.

15. A device comprising:
a substrate having a planar surface;
a first electrode formed on the substrate;
a structural layer formed on the substrate from a first electrically conductive material, the structural layer including a movable mass and a fixed portion, the movable mass being suspended above the substrate and the first electrode being interposed between the substrate and the movable mass and separated from the movable mass by a first gap;
a second electrode formed on the substrate above the structural layer and spaced apart from an upper surface of the movable mass by a second gap, wherein the first and second electrodes are aligned with one another in a direction perpendicular to the planar surface of the substrate and the movable mass is located between the first and second electrodes;
an anchor formed on the substrate above a first section of the fixed portion of the structural layer, wherein the anchor couples the second electrode to the first section of the fixed portion of the structural layer; and
a connection element formed on the substrate and disposed between the second electrode and the second section of the fixed portion of the structural layer, wherein the connection element electrically connects the second electrode to the second section of the fixed portion of the structural layer, the first and second sections of the fixed portion being electrically isolated from the movable mass.

16. The device of claim 15 wherein the first and second electrodes are immovable relative to the movable mass.

17. The device of claim 16 wherein the movable mass is configured for displacement along a first axis perpendicular to the planar surface of the substrate in response to a physical stimulus, and the first and second electrodes are configured as a differential electrode pair for detecting the displacement of the movable mass along the first axis.

18. The device of claim 16 wherein:
the movable mass is configured to undergo oscillatory drive motion relative to a drive axis that is substantially parallel to the planar surface and the movable mass is further configured to undergo oscillatory sense motion along a sense axis perpendicular to the planar surface of the substrate in response to an angular velocity about an input axis that is perpendicular to each of the drive and sense axes; and
the first and second electrodes are configured to receive a corrective voltage, the corrective voltage being configured to compensate for a quadrature motion of the movable mass along the sense axis resulting from the oscillatory drive motion along the drive axis.

19. The device of claim 15 wherein:
the structural layer is formed from a first electrically conductive material;
the second electrode, the anchor, and the connection element are formed from a monolithic segment of second electrically conductive material; and
the device further comprises an electrically insulating material interposed between the anchor and the first section of the fixed portion.

* * * * *